United States Patent
Tseng et al.

[11] Patent Number: 6,063,660
[45] Date of Patent: May 16, 2000

[54] FABRICATING METHOD OF STACKED TYPE CAPACITOR

[75] Inventors: Hua-Chou Tseng, Hsinchu; Tony Lin, Kaohsiung Hsien; Horng-Nan Chern, Tainan Hsien, all of Taiwan

[73] Assignee: United Microelectronics Corp., Hsin-Chu, Taiwan

[21] Appl. No.: 09/052,685

[22] Filed: Mar. 31, 1998

[30] Foreign Application Priority Data

Jan. 14, 1998 [TW] Taiwan ................................. 87100405

[51] Int. Cl.[7] .............................................. H01L 21/8242
[52] U.S. Cl. ........................... 438/253; 438/254; 438/397
[58] Field of Search .................................. 438/239, 240, 438/241, 253, 254, 255, 396, 397, 399

[56] References Cited

U.S. PATENT DOCUMENTS

| | | | |
|---|---|---|---|
| 5,170,233 | 12/1992 | Liu et al. | 438/397 |
| 5,384,276 | 1/1995 | Ogawa et al. | 438/254 |
| 5,656,536 | 8/1997 | Wu | 438/397 |
| 5,744,387 | 4/1998 | Tseng | 438/253 |
| 5,786,259 | 7/1998 | Kang | 438/396 |
| 5,789,267 | 8/1998 | Hsia et al. | 438/396 |
| 5,834,357 | 11/1998 | Kang | 438/396 |
| 5,843,822 | 12/1998 | Hsia et al. | 438/254 |
| 5,851,876 | 12/1998 | Jenq | 438/254 |
| 5,877,062 | 3/1999 | Horii | 438/396 |
| 5,878,987 | 3/1999 | Wang | 438/253 |
| 5,891,772 | 4/1999 | Hsu | 438/254 |

*Primary Examiner*—Charles Bowers
*Assistant Examiner*—Jack Chen
*Attorney, Agent, or Firm*—Merchat & Gould, P.C.

[57] ABSTRACT

A fabricating method and a structure of a stacked-type capacitor is provided comprising forming a first dielectric layer having a first via on a semiconductor substrate. A first conductive layer is filled into the first via. Then, insulating layers and dielectric layers are formed. A photolithography step is used to form a second dendriform via in the insulating layers and the dielectric layers. A second conductive layer is filled in the second dendriform via. The insulating layers and conductive layers are removed to form a dendriform lower electrode. The dendriform electrode provides a larger surface area to increase capacitance. Further, a polysilicon layer of hemispherical grains is formed to increase the surface area of the lower electrode.

12 Claims, 10 Drawing Sheets

FABRICATING METHOD OF STACKED TYPE CAPACITOR

CROSS-REFERENCE TO RELATED APPLICATION

This application claims the priority benefit of Taiwan application Ser. No. 87100405, filed Jan. 14, 1998, the full disclosure of which is incorporated herein by reference.

BACKGROUND OF THE INVENTION

1. Field of the Invention

The invention relates in general to the fabrication of dynamic random access memories (DRAM), and more particularly to the fabrication of a DRAM capacitor to advance the surface area of a storage electrode in the capacitor and to enhance the useful area of the DRAM capacitor.

2. Description of the Related Art

When the functions of microprocessors are more and more powerful and the programs and operations executed by software are more and more colossal, the market for memory capacity is greater and greater. FIG. 1 is a schematic diagram showing a memory cell in DRAM devices. As shown, a memory cell comprises with a transistor 10 and a storage electrode 11, in which a source of the transistor 10 is coupled with a corresponded bit line 12, a gate of the transistor 10 is coupled with a word line 13 and a drain is coupled with the storage electrode 14 (or lower electrode 14) of the storage capacitor 11. A plate electrode 15 (or upper electrode 15 or cell electrode 15) of the storage electrode 11 is connected to a fixed voltage source, and there is a dielectric layer located between the storage electrode 14 and plate electrode 15.

A capacitor is the heart of the DRAM for information storage. If the charge stocked in the capacitor increase, the effect from noise when reading the information will be greater, for example, soft errors formed from α particles will drop the refresh frequency. Methods of enhancing the capacitance of a storage capacitor for stocking charge include: (1) adding the dielectric constant of a dielectric layer to increase the charge stocked in a unit area of a capacitor, (2) decreasing the thickness of a dielectric layer but then the quality of a dielectric thickness to a minimum, (3) adding the area of a capacitor to increase the charge stocked in the capacitor, but then integrating of DRAM decreases.

When the capacitance of a conventional DRAM is small, the process of integrated circuits is conducted by a two-dimensional capacitor, a planar-type capacitor. This planar-type capacitor needs to employ a large area of a semiconductor substrate for stocking, charge so it isn't applied at a high integration. A capacitor in a highly integrated DRAM needs to employ a three-dimensional structure, for example, a stacked-type capacitor or a trench-type capacitor. When the DRAM device is designed toward even higher integration, the simple three-dimensional structured capacitor isn't adequate. Thus methods of adding, surface area to capacitorwithin a limited scope in DRAM are used.

FIGS. 2A–2D show a method of fabricating a conventional trench-type capacitor structure. Referring to FIG. 2A, a substrate 200 is provided, on which at least a field oxide layer 201, a gate electrode 202, source/drain regions 203, 204 and 205 and a first insulating layer 206 covering the gate electrode 202 are formed. Then, a first polysilicon layer is formed and patterned by using photolithography techniques to form a bit line 207 coupling with the source/drain region 204. A second insulating layer 208 is deposited, and patterned to make the second insulating layer 208 covering the bit line 207 and exposing the source/drain region 205.

Referring to FIG. 2B, a first thin and doped polysilicon layer 209 is formed and coupled with the source/drain region 205. The first thin and doped polysilicon layer 209 is covered with a photoresist layer 210, and patterned to form a via 211. An oxide material 212 is filled into the via 211. The photoresist layer 210 is removed and a second thin and doped polysilicon layer 213 forms the structure shown in FIG. 2C. Referring to FIG. 2D, the second polysilicon layer 213 on the oxide material 212 is removed to expose the oxide material 212. Then, the oxide material 212 filled into the second polysilicon layer 213 is removed to form a storage electrode coupling with the source/drain region 204. After forming a dielectric layer on the storage electrode, a third doped polysilicon layer is provided to form a planar electrode. Then, the back-end processes which include forming a metal contact and a insulated defensive layer are performed to finish the DRAM structure.

FIG. 3 is a cross-sectional view of a conventional stacked-type DRAM capacitor structure. Referring to FIG. 3, first a semiconductor substrate 30 is provided, on which a metal oxide semiconductor transistor 32 (MOS) is formed. The MOS 32 comprises a gate electrode 33, a source/drain region 34 and a spacer 35. There are a field oxide layer 36 and an insulating layer 38 on the semiconductor substrate 30. A insulating layer 38 is deposited and etched at the site on the specific source/drain region 34 to form a contact. In sequence, a lower electrode 39, a dielectric layer 310 and an upper electrode 311 are provided on the contact to form a stacked-type capacitor 312. The dielectric layer 310 has a structure comprising a silicon nitride layer and a silicon oxide layer (NO), or comprising a silicon oxide layer, a silicon nitride layer and a silicon oxide layer (ONO). The lower electrode 39 and the upper electrode 311 are polysilicon layers, and the lower electrode 39 has a ragged surface. Last, the back-end processes which include forming a metal contact and a insulated defensive layer are performed to finish the DRAM structure.

Currently, a method of fabricating a DRAM capacitor is to improve a surface format of the capacitor by making several ragged surfaces. Although surface area is increased to enhance the capacitance, the degree of enhancement is limited. The method can't be used at higher capacitance or in smaller devices. Furthermore, the method has a complex process that repetitively uses, deposition and etching to form the required capacitor structure. This makes the process complicated and increases the cost.

SUMMARY OF THE INVENTION

It is therefore an object of the invention to provide a fabricating method and a structure of a stacked-type capacitor, whereby surface of a capacitor is increased and the capacitance is enhanced. This capacitor is applied in smaller semiconductor devices.

It is another object of the invention to provide a fabricating method and a structure of a stacked-type capacitor. The fabricating method uses a simplified process to form a capacitor. The capacitor can satisfy the need for high capacitance.

The invention achieves the above-identified objects by providing a fabricating method and a structure of a stacked-type capacitor. The fabricating method of a stacked-type capacitor includes the following steps of: first forming a first dielectric layer on a semiconductor substrate, wherein a first via is formed in the first dielectric layer. A first conductive layer is filled into the via. A first insulating layer, a second dielectric layer, a second insulating layer and a third dielectric layer are alternatingly stacked. A photolithography step is performed to form a dendriform second via in the insulating layer and the dielectric layer. A conductive material is selectively forms a second conductive layer in the dendriform second via. All of the insulating layers and dielectric layers are removed to form a dendriform lower electrode. A polysilicon layer of hemispherical grains can be used to increase a surface of the lower electrode. Then, on the lower electrode, a dielectric layer is formed and a upper electrode is formed on it.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

FIG. 4A–4I are cross-sectional views showing the progression of manufacturing steps for forming a DRAM capacitor in one preferred embodiment according to the invention.

Figure 1:
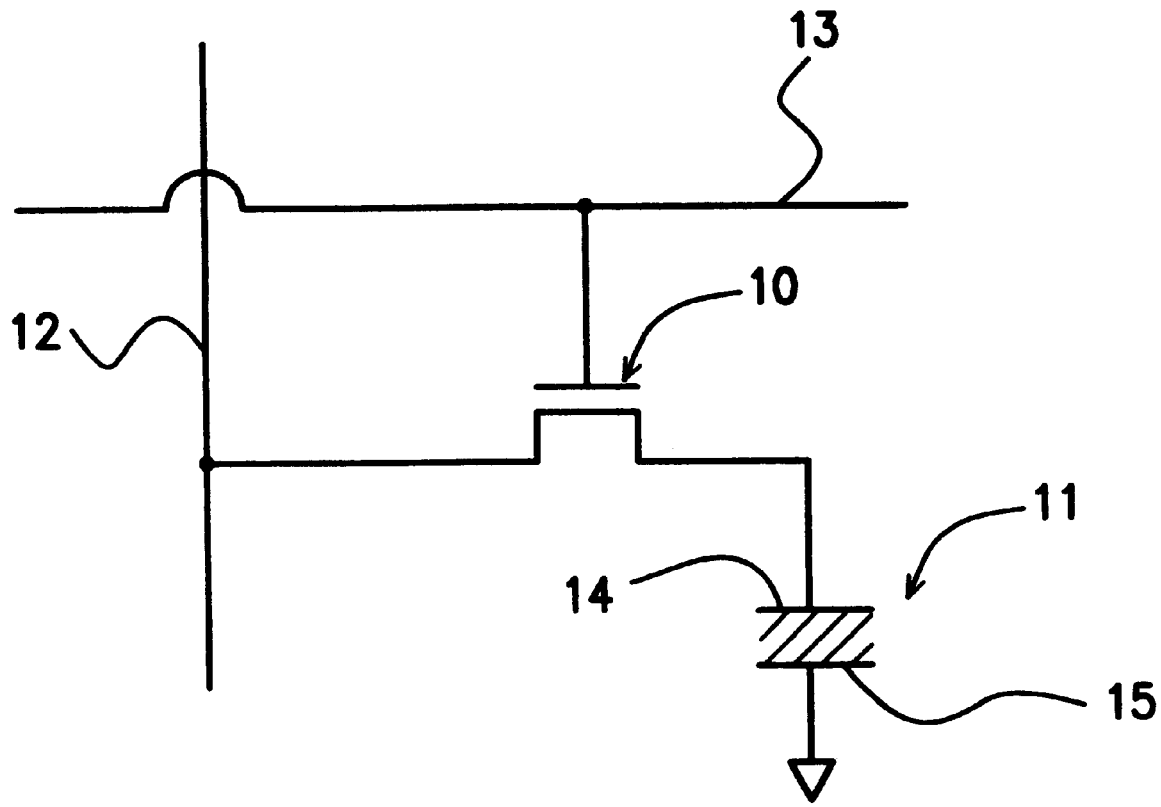
FIG. 1 is the circuit diagram of a memory cell of a DRAM device.
Figure 2A:
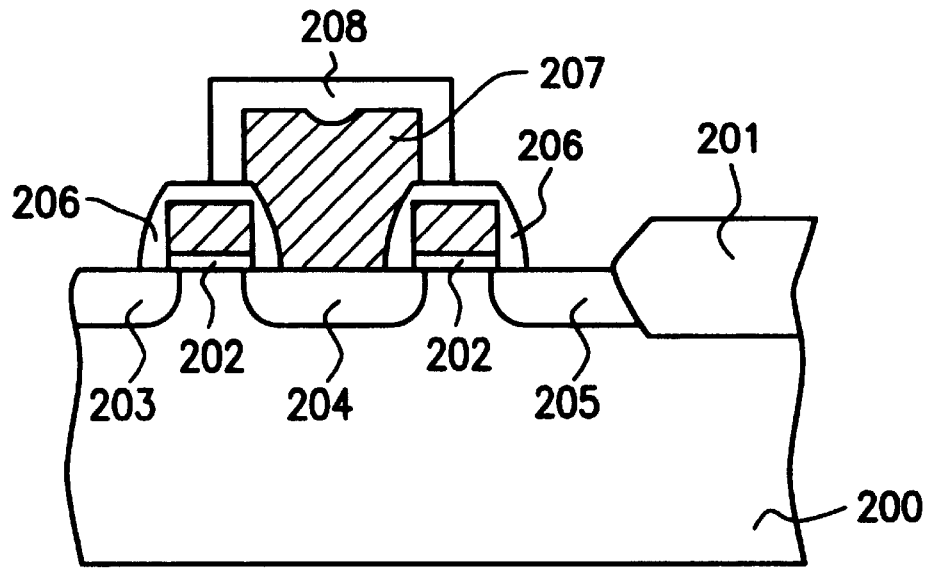
FIGS. 2A–2D are cross-sectional views showing the progression of manufacturing steps for forming a conventional trench-type DRAM capacitor.
Figure 2B:
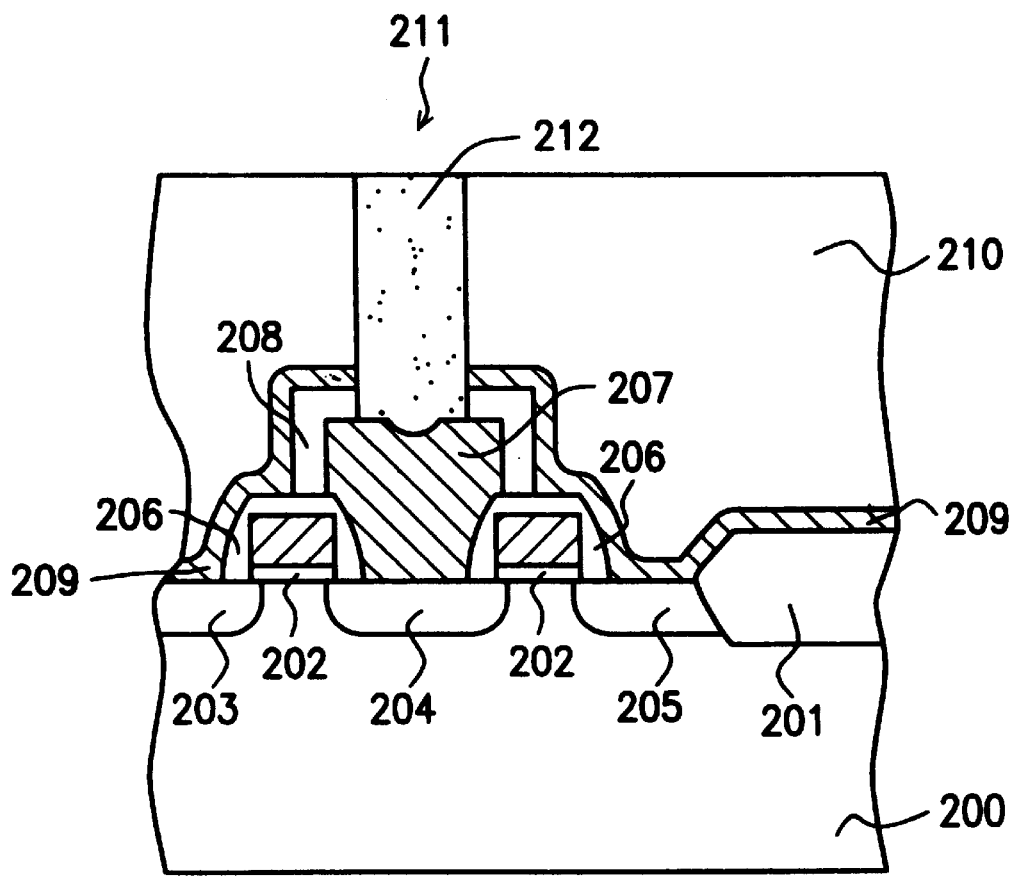
Figure 2C:
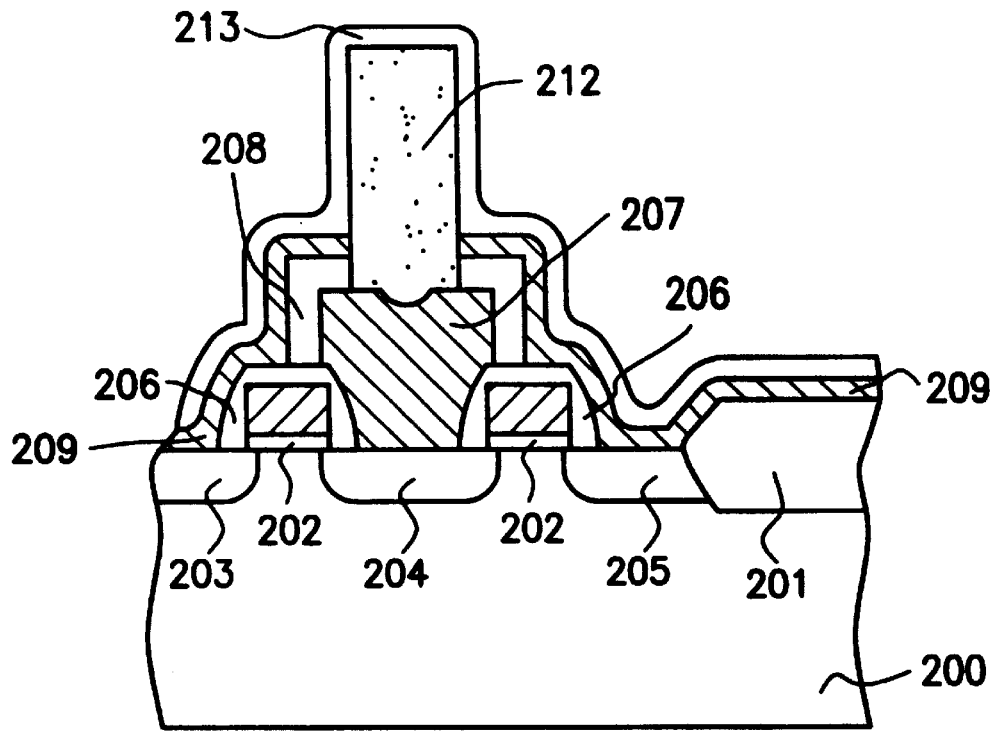
Figure 2D:
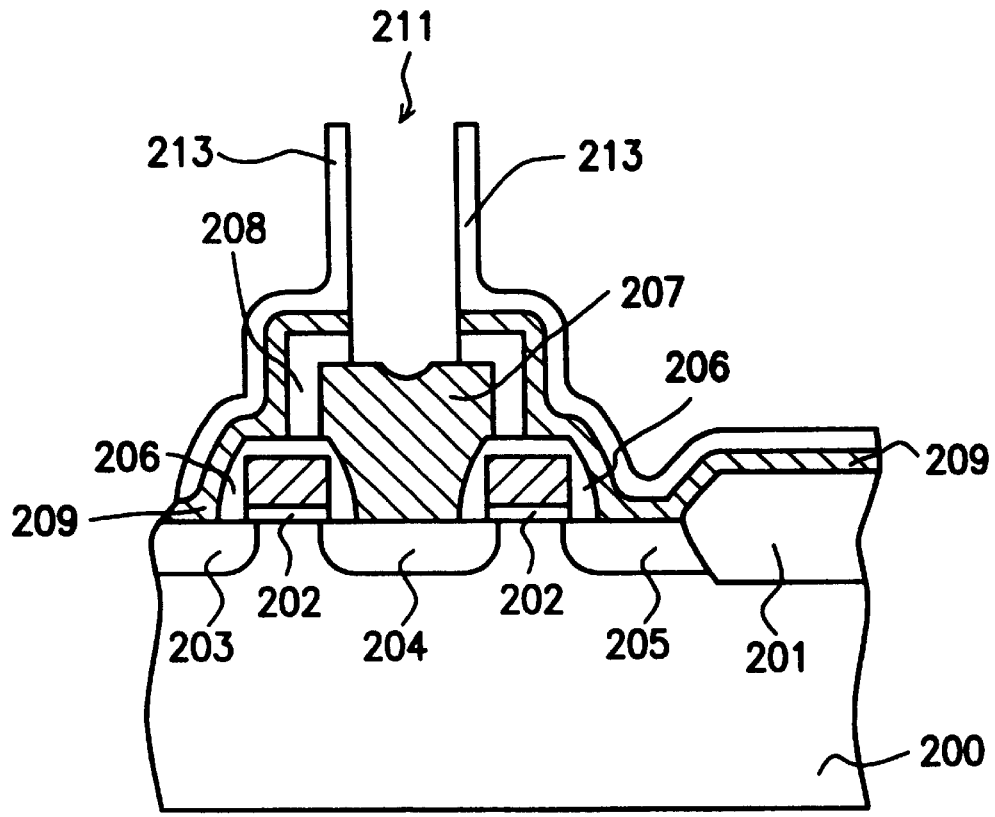
Figure 3:
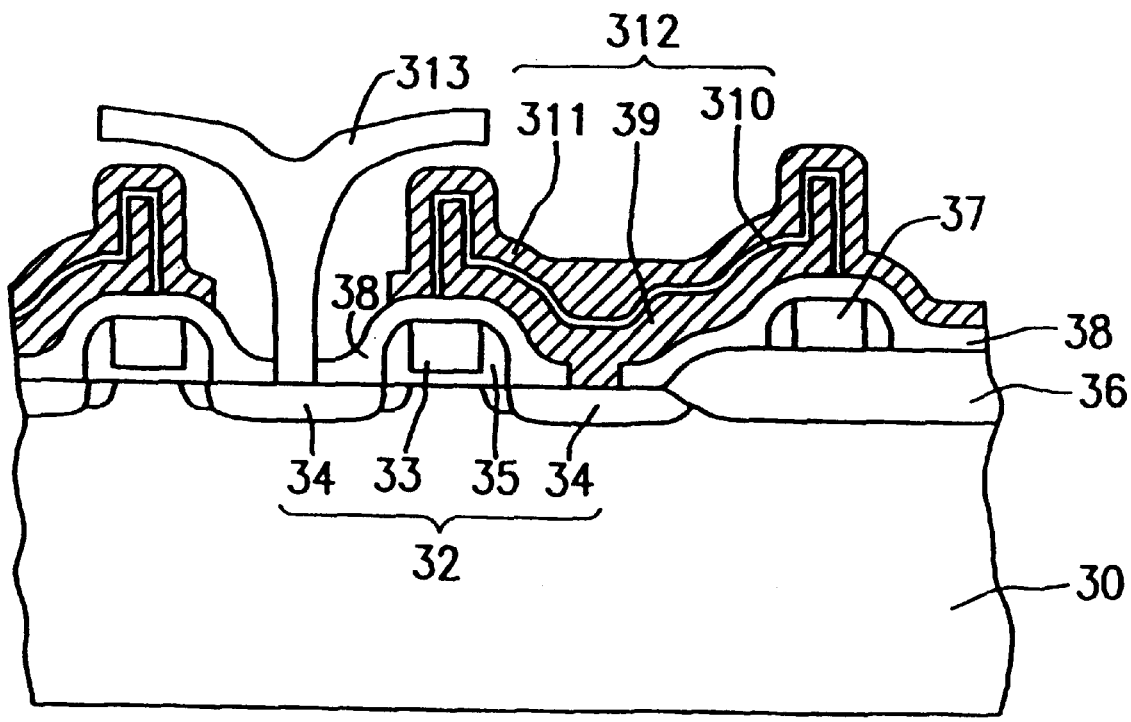
FIG. 3 is a cross-sectional view of a conventional stack-type DRAM capacitor.
Figure 4A:
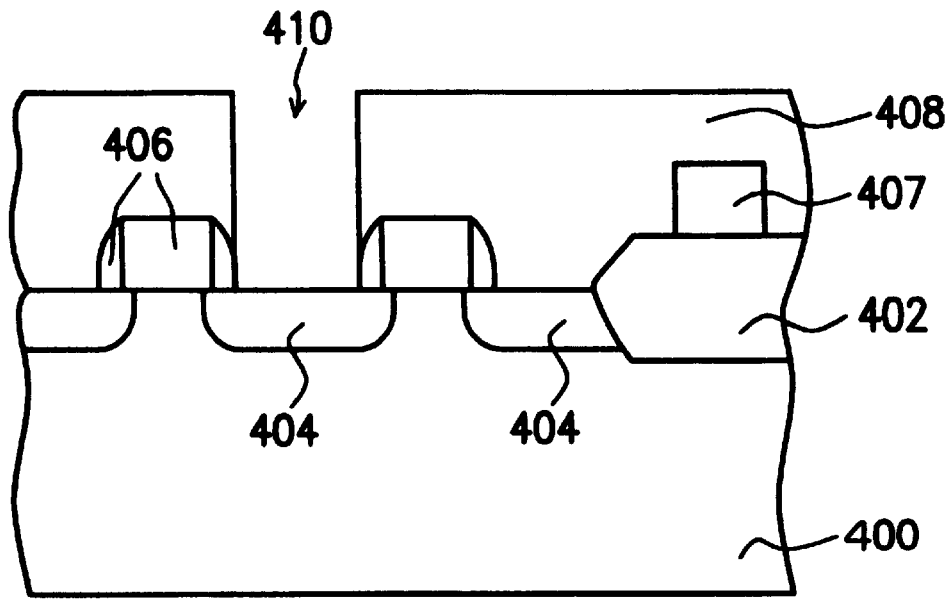
FIGS. 4A–4I are cross-sectional views showing the progression of manufacturing steps for forming a DRAM capacitor in one preferred embodiment according to the invention.

Referring first to FIG. 4A, a semiconductor substrate 400 is provided, for example, a silicon substrate, wherein a field oxide layer 402, a source/drain region 404, a gate electrode 406 and a conducting structure 407 sitting on the field oxide layer 402 are formed on the semiconductor substrate 400. The source/drain region 404 and the gate electrode 406 compose a transistor. A first dielectric layer 408 is formed on the semiconductor substrate 400, wherein a first via 410 is coupled with the source/drain region 404 of the transistor on the semiconductor substrate 400. The first via 410 is formed, for example, using a photo mask to perform a photolithography process. The photolithography process includes patterning the first via 410 at the first dielectric layer 408 and etching to remove partial of the first dielectric layer 408 and to form the first via 410.

Figure 4B:
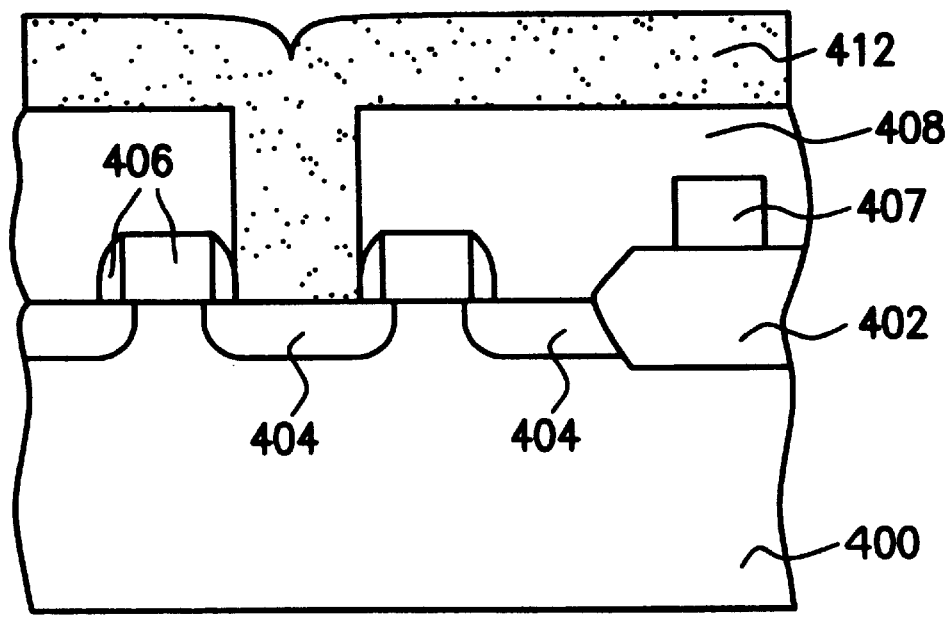

Referring to FIG. 4B, a first conductive layer 412 is formed on the first dielectric layer 408 and filled into the first via 410. The material of the first conductive layer 412 is, for example, polysilicon formed by chemical vapor deposition (CVD).

Figure 4C:
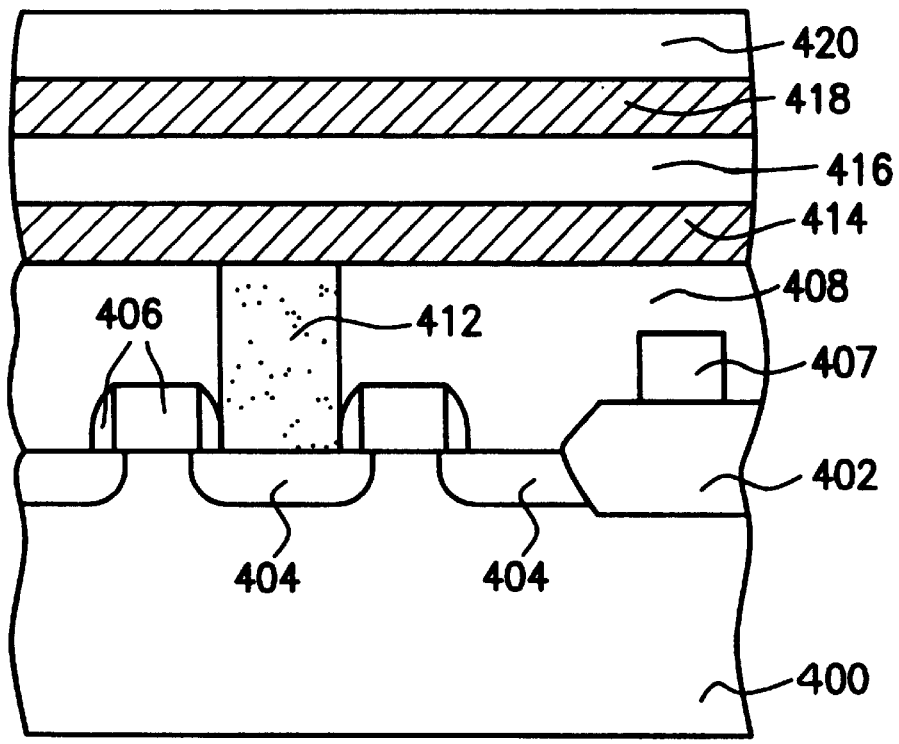

Referring to FIG. 4C, the first conductive layer 412 is partially removed by chemical mechanical polishing (CMP) or etching back to expose the first dielectric layer 408, leaving first via 410 in the first dielectric layer 408 filled with the remainder of the first conductive layer 412. After the first conductive layer 412 is partially removed, a first insulating layer 414, a second dielectric layer 416, a second insulating layer 418 and a third dielectric layer 420 are formed in sequence on the dielectric layer 408. All of them are formed by CVD with various reactive gases. The first insulating layer 414 and the second insulating layer 418 are, for example, silicon nitride and have a thickness of about 500–1000 Å. The second dielectric layer 416 and the third dielectric layer 420 are, for example, silicon oxide.

Figure 4D:
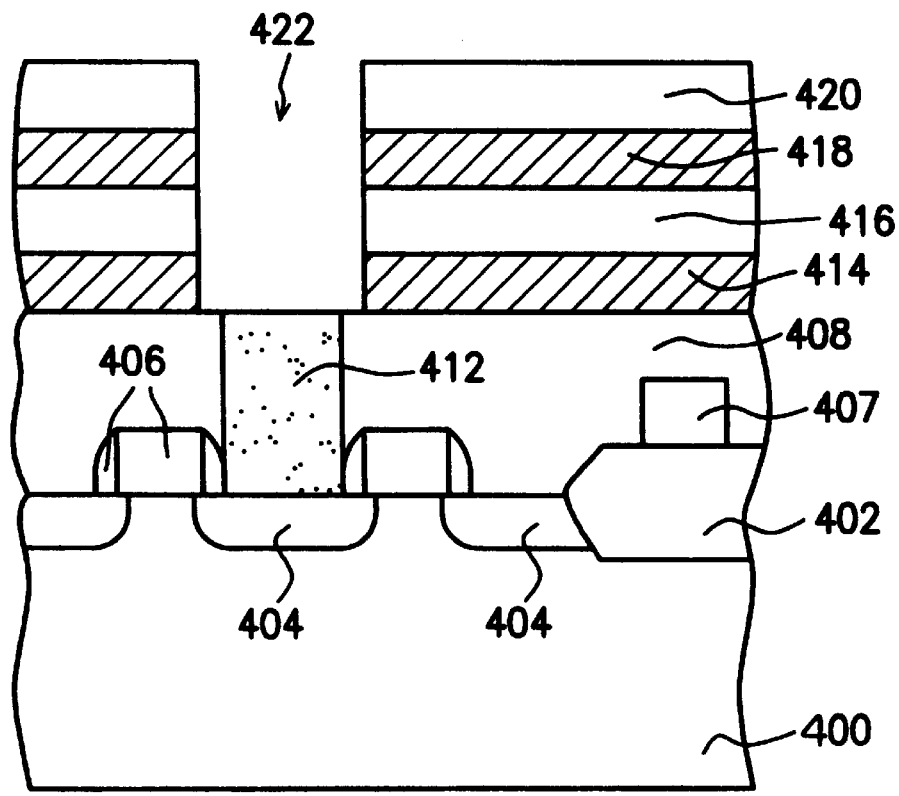

Referring to FIG. 4D, a photolithography step is performed by using a photo mask to pattern a second via 422 on the third dielectric layer 420. Part of the third dielectric layer 420, the second insulating layer 418 the second dielectric layer 416 and the first insulating layer 414 are removed by etching to form the second via 422. The site of second via 422 corresponds the first via 410 and the size of the second via 422 is larger than the first via 410. The second via 422 is formed, for example, by performing reactive ion etching (RIE) or anisotropic etching at the third dielectric layer 420, the second insulation layer 418, the second dielectric layer 416 and the first insulation 414.

Figure 4E:
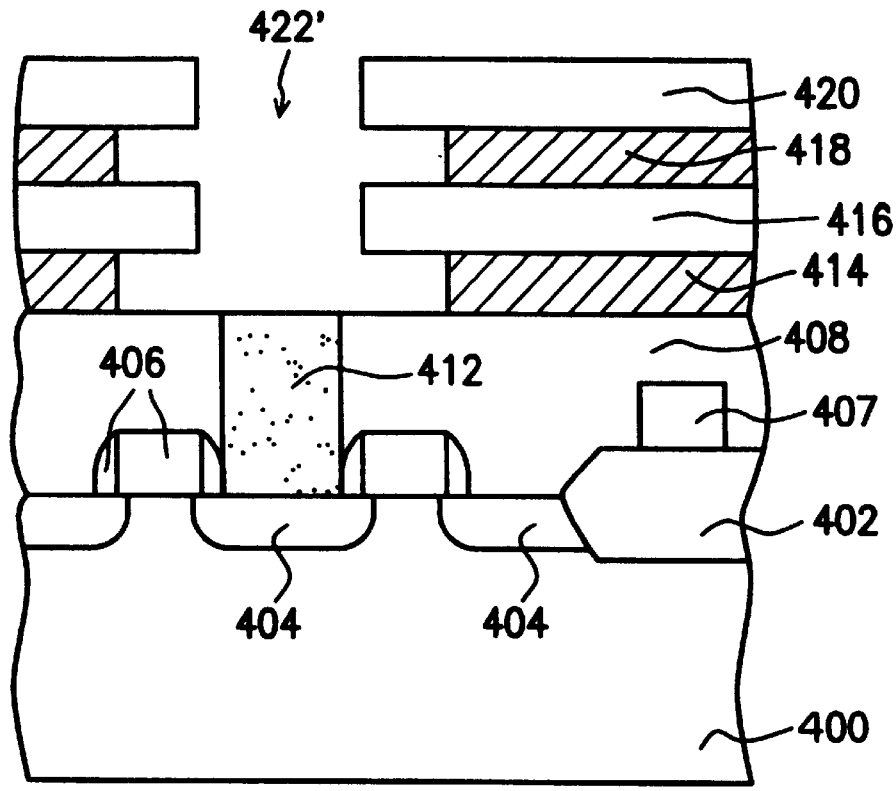

Referring to FIG. 4E, partial of the second insulating layer 418 and the first insulating layer 414 forming in the second via 422 are removed by selectively adjusting etching rate to invaginate the margin of the insulating layers 414 and 418. It makes a larger space in the insulating layers 414 and 418 and forms a dendriform second via 422'. The insulating layers 414 and 418 are removed by plasma etching, isotropic etching or wet etching.

Figure 4F:
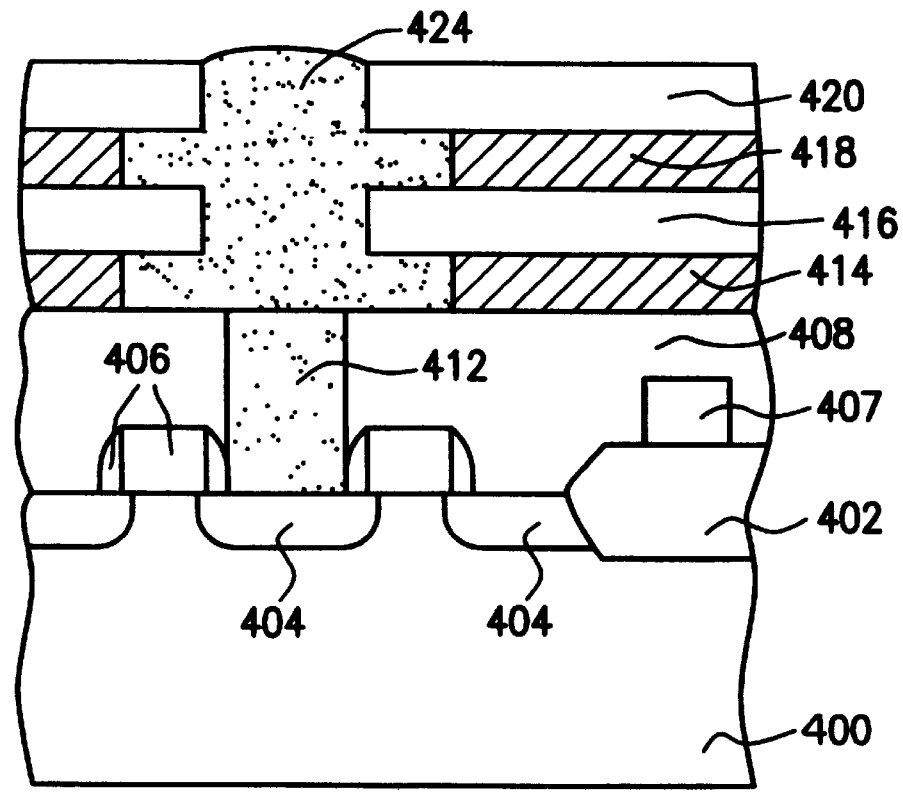

Referring to FIG. 4F, a second conductive layer 424 is formed selectively in the dendriform second via 422' to fill the dendriform second via 422'. The material of the second conductive layer 424 is, for example, polysilicon. The second conductive layer 424 is promoted selectively by using the first conductive layer 412 to be a nucleating seed. There is no photolithography process and etching process during formation of the second conductive layer 424.

Figure 4G:
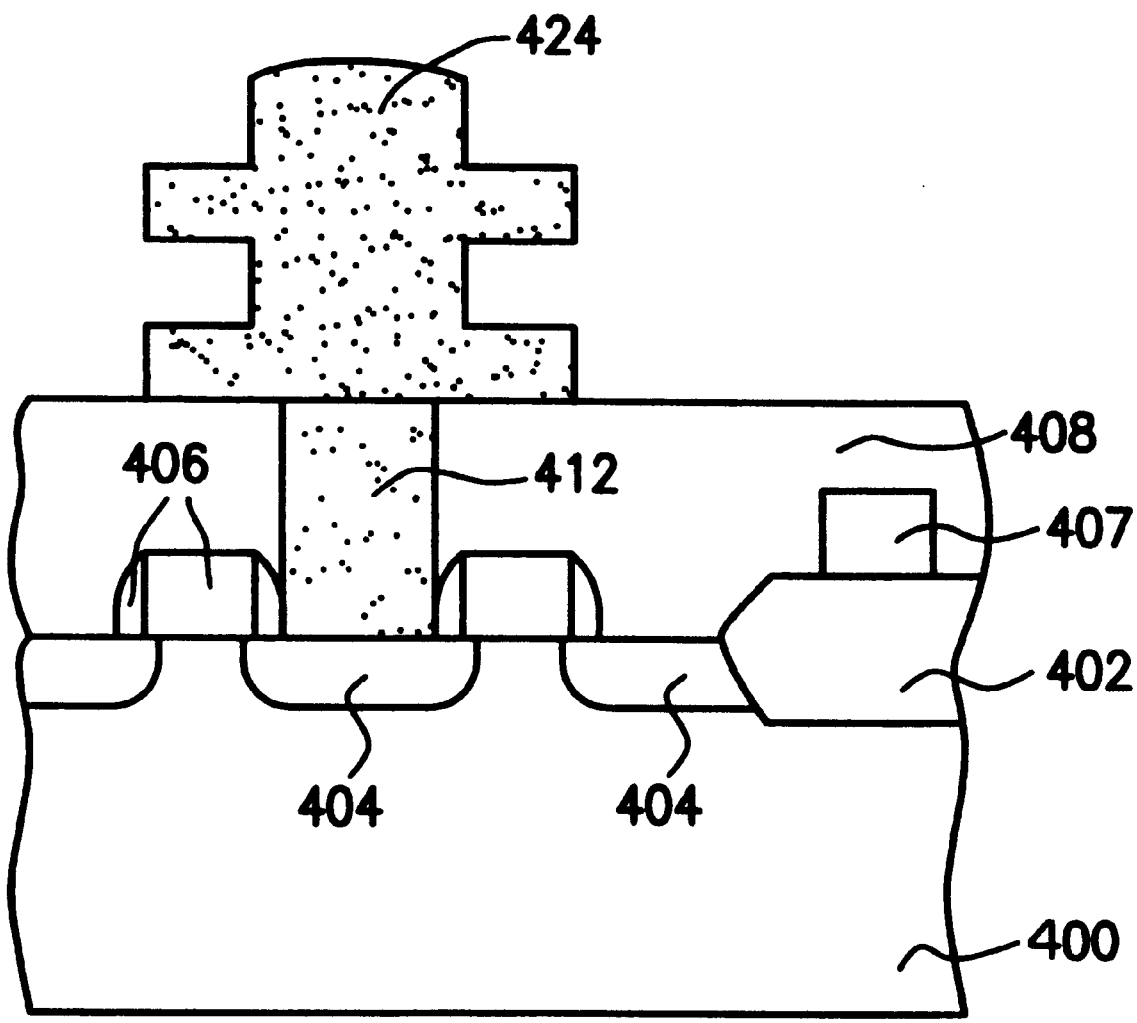

Referring to FIG. 4G, the third dielectric layer 420, the second insulation layer 418, the second dielectric layer 416 and the first insulating layer 414 are all removed to expose the dendriform second conductive layer 424. The second conductive layer 424 and the first conductive layer 412 compose to form a lower electrode of a capacitor structure.

Figure 4H:
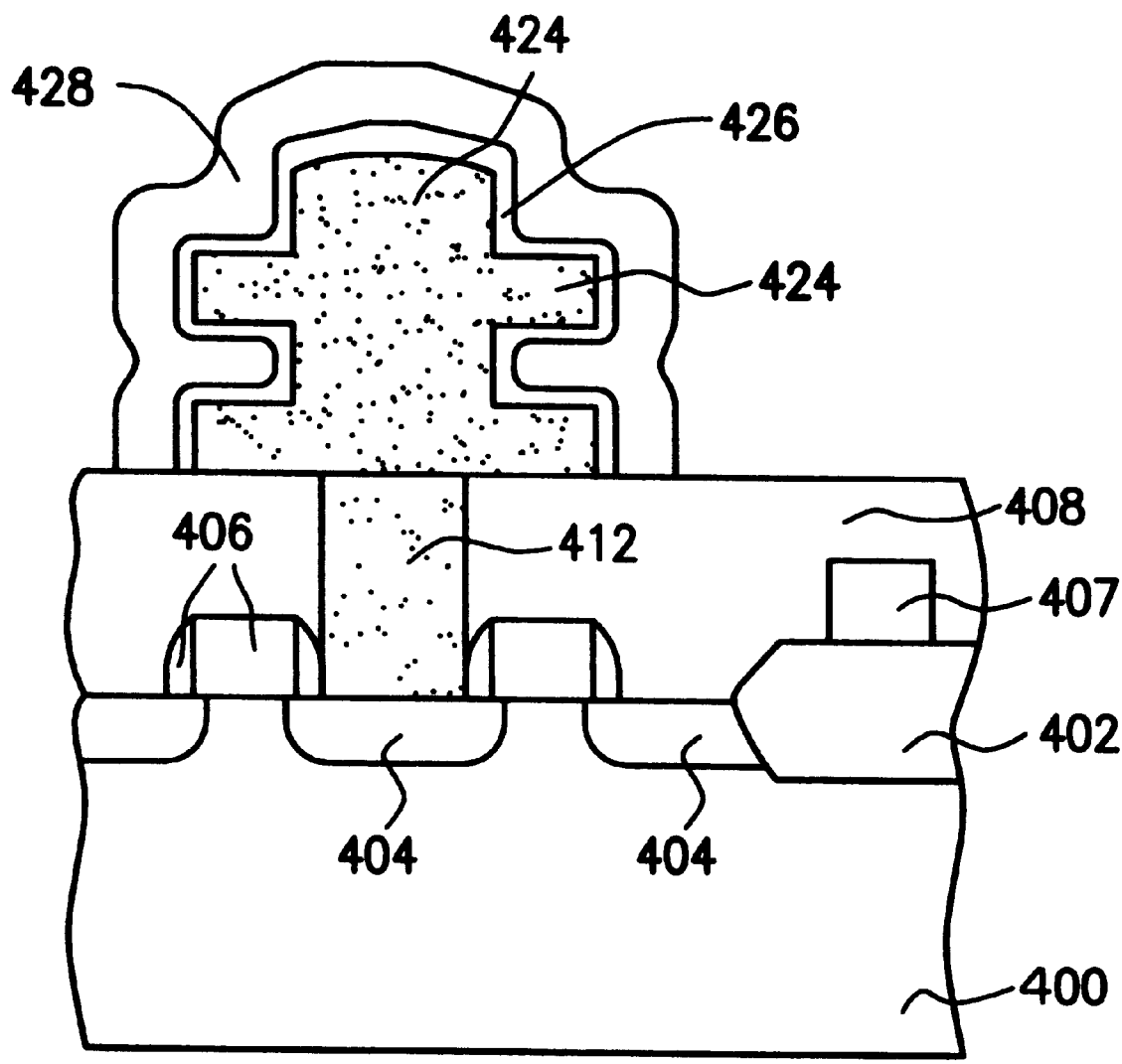

Referring to FIG. 4H, a dielectric film layer 426 is formed to cover the second conductive layer 424. The structure of the dielectric film layer 426 is composed of silicon oxide/silicon nitride/silicon oxide. Further, a third conductive layer 428 is formed on the dielectric film layer 426 to form an upper electrode 428 of the capacitor. The upper electrode 428 is, for example, polysilicon.

Figure 4I:
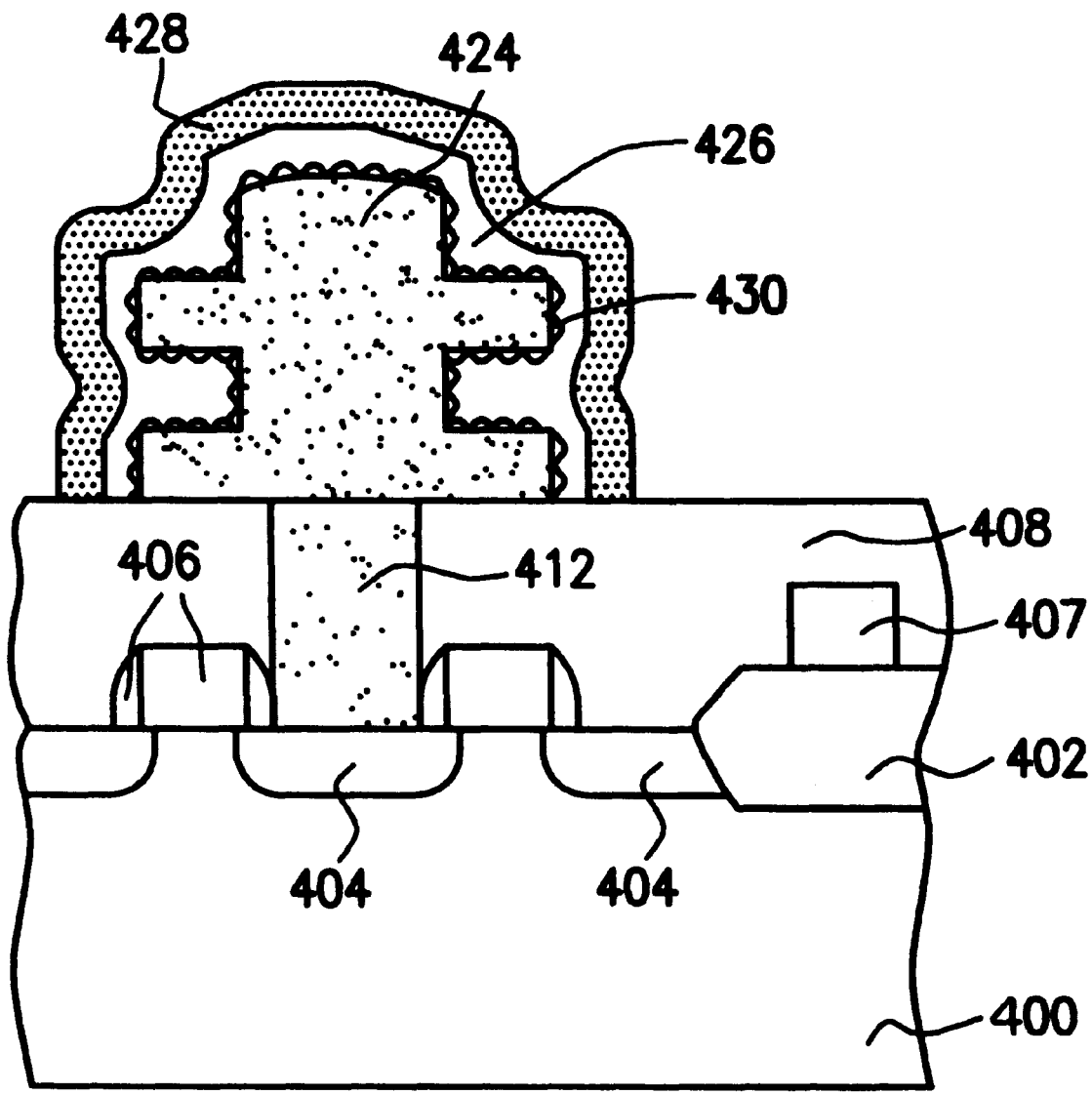

Additionally, referring to FIG. 4I, before the dielectric film layer 426 formed, a polysilicon layer of hemispherical grains 430 is formed to increase a surface area of the upper electrode 428.

The invention provides a polysilicon filled in the first via to be a nucleated seed. It makes the second conductive layer promote selectively to fill in the second dendriform via. A stacked-type structure is composed with silicon oxide and silicon nitride and a selective etching step is performed to form a dendriform upper electrode. The dendriform upper electrode increases the surface area of the upper electrode in smaller size devices to meet the demand for high capacitance.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A fabricating method of a stacked-type capacitor, comprising the steps of:
   providing a semiconductor substrate, wherein the semiconductor substrate at least comprises a transistor composing a gate electrode and a source/drain region, a field oxide layer and a conducting structure on the field oxide layer;
   forming a first dielectric layer on the semiconductor substrate, wherein a via is formed in the first dielectric layer to expose the source/drain region;
   forming a first conductive layer on the first dielectric layer and into the via;
   forming a first insulating layer on the first dielectric layer;
   forming a second dielectric layer on the first insulating layer;
   forming a second insulating layer on the second dielectric layer;
   forming a third dielectric layer on the second insulating layer;
   partially removing the third dielectric layer, the second dielectric layer, the first insulating layer and the second insulating layer to form a channel to expose the first conductive layer and the first dielectric layer, wherein the channel is directly located on the source/drain region;
   partially removing the first insulating layer and the second insulating layer around the channel to invaginate the margins of the first insulating layer and the second insulating layer to form a dendriform channel;
   selectively forming a second conductive layer by using the first conductive layer as a nucleating seed to fill the dendriform channel to form a dendriform lower electrode;
   removing all the first insulating layer, the second insulating layer, the second dielectric layer and the third dielectric layer to expose the dendriform lower electrode;
   forming a dielectric film on the dendriform lower electrode; and
   forming a third conductive layer on the dielectric film.

2. A fabricating method according to claim 1, wherein a polysilicon layer of hemispherical grains is formed after removing all the first insulating layer, the second insulating layer, the second dielectric layer and the third dielectric layer.

3. A fabricating method according to claim 1, further comprising the step of etching back the first conductive layer to expose the first dielectric layer.

4. A fabricating method according to claim 1, further comprising the step of chemical mechanical polishing the first conductive layer to expose the first dielectric layer.

5. A fabricating method according to claim 1, wherein the step of partially removing the third dielectric layer, the second dielectric layer, the first insulating layer and the second insulating layer to form a channel to expose the first conductive layer is promoted by reactive ion etch.

6. A fabricating method according to claim 1, wherein the step of partially removing the third dielectric layer, the second dielectric layer, the first insulating layer and the second insulating layer to form a channel to expose the first conductive layer is promoted by anisotropic etch.

7. A fabricating method according to claim 1, wherein the first insulating layer and the second insulating layer are silicon nitride.

8. A fabricating method according to claim 7, wherein thickness of the first insulating layer and the second insulating layer is about 500–1000 Å.

9. A fabricating method according to claim 7, wherein the step of partially removing the first insulating layer and the second insulating layer around the channel comprises isotropic etching.

10. A fabricating method according to claim 7, wherein the step of partially removing the first insulating layer and the second insulating layer around the channel comprises wet etching.

11. A fabricating method according to claim 1, wherein the dielectric film is composed of a silicon oxide/silicon nitride/silicon oxide structure.

12. A fabricating method of a stacked-type capacitor, comprising the steps of:
   providing a semiconductor substrate, wherein the semiconductor substrate at least comprises a transistor composed of a gate electrode and a source/drain region;
   forming a first dielectric layer on the semiconductor substrate, wherein a via is formed in the first dielectric layer to expose the source/drain region;
   forming a first conductive layer on the first dielectric layer and into the via;
   forming a first insulating layer on the first dielectric layer;
   forming a second dielectric layer on the first insulating layer;
   forming a second insulating layer on the second dielectric layer, wherein materials of the first insulating layer and the second insulating layer are the same;
   forming a third dielectric layer on the second insulating layer, wherein materials of the third dielectric layer and the second dielectric layer are the same;
   etching through the third dielectric layer, the second insulating layer, the second dielectric layer and the first insulating layer to form a channel exposing the first conductive layer and the first dielectric layer, wherein the channel is directly located on the source/drain region;
   partially removing the first insulating layer and the second insulating layer around the channel to invaginate the margins of the first insulating layer and the second insulating layer such that a dendriform channel is formed;
   selectively forming a second conductive layer by using the first conductive layer as a nucleating seed to fill the dendriform channel and form a dendriform lower electrode, wherein the step of forming the second conductive layer is performed without a photolithography process or an etching process;
   after forming the lower electrode, removing all the first insulating layer, the second insulating layer, the second dielectric layer and the third dielectric layer to expose the dendriform lower electrode;
   forming a capacitor dielectric film on the lower electrode; and
   forming an upper electrode on the capacitor dielectric film.

* * * * *